(12) United States Patent  
Rowell et al.

(10) Patent No.: US 10,677,831 B2  
(45) Date of Patent: Jun. 9, 2020

(54) TEST SYSTEM AND METHOD FOR MEASURING BEAM CHARACTERISTICS

(71) Applicant: Rohde & Schwarz GmbH & Co. KG, Munich (DE)

(72) Inventors: Corbett Rowell, Munich (DE); Vincent Abadie, Hohenschaeftlarn (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 339 days.

(21) Appl. No.: 15/706,143

(22) Filed: Sep. 15, 2017

(65) Prior Publication Data

US 2018/0340967 A1 Nov. 29, 2018

Related U.S. Application Data

(63) Continuation-in-part of application No. 15/607,317, filed on May 26, 2017.

(51) Int. Cl.
 *G01R 29/10* (2006.01)
 *G01R 31/28* (2006.01)
 *H01Q 3/04* (2006.01)
 *H04B 17/15* (2015.01)
 (Continued)

(52) U.S. Cl.
 CPC ......... *G01R 29/10* (2013.01); *G01R 29/0814* (2013.01); *G01R 31/2806* (2013.01); *G01R 31/2822* (2013.01); *H01Q 3/04* (2013.01); *H04B 17/15* (2015.01); *H01Q 13/02* (2013.01)

(58) Field of Classification Search
 CPC . G01R 29/0814; G01R 31/2822; H04B 17/15
 See application file for complete search history.

(56) References Cited

U.S. PATENT DOCUMENTS 6,285,330 B1 * 9/2001 Perl ................. G01R 29/10
 342/360
2003/0156585 A1 8/2003 Minami et al.
2008/0067397 A1 3/2008 Tsukihara et al.
(Continued)

FOREIGN PATENT DOCUMENTS

EP 2194387 A1 6/2010
WO WO2009038388 A1 3/2009

*Primary Examiner* — Alvaro E Fortich
(74) *Attorney, Agent, or Firm* — Protomac Technology Law, LLC

(57) ABSTRACT

A test system for measuring beam characteristics of a device under test (DUT), comprising a first antenna for receiving electro-magnetic radiation emitted by the device under test or for establishing a first test communication link to exchange test communication data with the DUT. The system further comprises a switch for setting the mode of the first antenna to a measuring or communication mode, and a test interface for inputting beam steering and/or communication data to the DUT. The system further comprises a control/analyzing processor for controlling beam steering of the DUT and to analyze signals from the DUT, e.g., received by the first antenna operated in the measuring mode. When the first antenna is set to the communication mode, test communication data is transmitted to the DUT through the first antenna. The test communication data comprises beam steering control data for controlling the beam steering of the DUT.

18 Claims, 7 Drawing Sheets

(51) Int. Cl.
  *G01R 29/08*     (2006.01)
  *H01Q 13/02*     (2006.01)

(56) References Cited

U.S. PATENT DOCUMENTS

| | | | | |
|---|---|---|---|---|
| 2011/0043418 | A1* | 2/2011 | Teshirogi | G01R 29/0821 |
| | | | | 343/703 |
| 2011/0115683 | A1 | 5/2011 | Herrmann | |
| 2012/0038522 | A1* | 2/2012 | Miyata | G01R 29/10 |
| | | | | 343/703 |
| 2012/0137779 | A1* | 6/2012 | Graff | G10K 11/002 |
| | | | | 73/632 |
| 2015/0346314 | A1* | 12/2015 | Underbrink | G01S 3/80 |
| | | | | 367/129 |
| 2016/0359718 | A1* | 12/2016 | Banerjee | H04L 43/50 |

* cited by examiner

TEST SYSTEM AND METHOD FOR MEASURING BEAM CHARACTERISTICS

PRIORITY

This application is a Continuation-in-Part, and claims the benefit of the earlier filing date under 35 U.S.C. § 120, from U.S. patent application Ser. No. 15/607,317 (filed 2017 May 26), the entirety of which is incorporated by reference herein.

TECHNICAL FIELD

The invention relates to a test system and a method for measuring beam characteristics of a device under test with the aid of a first antenna that can be operated in two different operating modes. In addition, a switch configured to select one of the two operating modes, a test interface and a control and analyzing unit are provided.

BACKGROUND

Generally, measuring beam characteristics of a device under test (DUT) requires an antenna to receive the radiation emitted by the DUT.

The WIPO publication WO 2009/038388 A1 relates to a system and a method for measuring a radiation pattern of an antenna under test by using a source antenna in an antenna radiation pattern measurement device. The document discloses that the antenna radiation pattern measurement device comprises a control unit for controlling driving of the source antenna and the antenna under test, an analysis unit for measuring an electric field value from a radio frequency signal that is transmitted from one of the source antenna and the antenna under test and received by the other antenna. The communication between the analysis unit/control unit and the antennas is realized via a cable connection. Disadvantageously, such cable connections influence the radiation characteristic of an antenna and increase the effort when preparing a test setup. Furthermore, cable connections increase the cost and the measurement error rate, since cables can be damaged or can change transmission properties due to wrong installation or rough handling.

Accordingly, there is a need for a test system and a method for measuring beam characteristics of a device under test (DUT), providing an improved communication link for transmitting beam steering control data in order to control the beam steering of the DUT.

SOME EXAMPLE EMBODIMENTS

Embodiments of the present invention advantageously address the foregoing requirements and needs, as well as others, by providing a test system and a method for measuring beam characteristics a device under test (DUT), providing an improved communication link for transmitting beam steering control data in order to control the beam steering of the DUT.

According to a first aspect of the invention, a test system for measuring beam characteristics of electro-magnetic radiation emitted by a device under test is provided. The test system comprises a device under test (DUT), a first antenna, a switch, a test interface and a control and analyzing unit. The test interface is configured to input test communication data, such as one or more of beam steering control data and communication data to the device under test. The control and analyzing unit is configured to control a beam steering of the device under test and to analyze signals from the device under test, for example, received by the first antenna. Advantageously, test communication data comprising beam steering control data in order to control the beam steering of the DUT is transmitted to the device under test, for example, through the first antenna, whereby the test interface provides beam locking means of a beam generated by the device under test.

According to a first implementation form of the first aspect, the beam locking means is configured to control beam steering such to lock the beam in a particular direction and to unlock the beam direction. Additionally or alternatively, the beam locking means locks or unlocks the beam in response to an input signal received by the test interface. Advantageously, the provided beam locking means allows easily locking or unlocking of a beam generated by the device under test.

According to a further implementation form of the first aspect, the switch is configured to set an operating mode of the first antenna, wherein the operating mode is a measuring mode or a communication mode. Advantageously, the same first antenna can be used in two different operating states. In one operating state, the first antenna is a measurement antenna and in a second operating state the first antenna is a communication antenna, wherein the switch controls the two different operating states.

According to a further implementation form of the first aspect, the measuring mode configures the first antenna to receive electro-magnetic radiation emitted by the device under test and the communication mode configures the first antenna to establish a first test communication link to the device under test.

According to a further implementation form of the first aspect, in the measuring mode the control and analyzing unit is configured to receive the signals to be analyzed from the device under test through the first antenna. Furthermore, in the communication mode, the control and analyzing unit is configured to one or more of receive test communication data from the device under test through the first antenna and transmit test communication data to the device under test through the first antenna.

According to a further implementation form of the first aspect, the first antenna is one or more of movable around the device under test and an array antenna configured to receive the electro-magnetic radiation emitted by the device under test and to transmit communication data to the device under test without moving the first antenna. Advantageously, by using an antenna array, no positioning unit is required to move the first antenna, since by appropriate control of the array antenna the beam can be electronically moved to achieve receiving and transmitting of electro-magnetic waves in different directions.

According to a further implementation form of the first aspect, the system includes a second antenna, the link antenna, configured to provide a second test communication link to the device under test.

According to a further implementation form of the first aspect, the second test communication link is established when the first antenna is set to the measuring mode. Advantageously, a second test communication link allows communication with the DUT, while the first antenna is in measuring mode. This allows to send an unlock beam signal to the DUT with the aid of the second communication link.

According to a further implementation form of the first aspect, the link antenna is positioned in the near field of the radiation emitted by the device under test. Advantageously, the positioning of the link antenna in the near field of the radiation of the device under test requires less transmission power of the link antenna to transmit data to the device under test. A reduced transmission power emitted by the link antenna prevents that the link antenna radiation influences the electro-magnetic radiation generated by the DUT. Thus, the measurement by the measuring antenna is not distorted by the wireless communication between the DUT and the control/analyzing unit via the link antenna. Furthermore, due to the positioning of the link antenna in the near field there is no need to reposition the link antenna when the beam characteristic is changed.

According to a further implementation form of the first aspect, the link antenna is located inside a radiation shielding area. Advantageously, shielding the link antenna avoids distortion of the electro-magnetic radiation emitted by the DUT and to be received by the first antenna operating in the measuring mode.

According to a further implementation form of the first aspect, the test communication data is transmitted through the link antenna. Additionally or alternatively, the link antenna is movable relative to the device under test. Advantageously, this allows for fine-tuning the link antenna position to the desired location in the near field.

According to a further implementation form of the first aspect, the device under test is mounted on a positioner configured to adjust the position of the device under test.

According to a further implementation form of the first aspect, the test interface is configured to receive one or more of beam steering data and communication data in one or more of a wireless manner and a cable connection. Advantageously, the transmission of beam steering data or communication data via cable and the wireless transmission of the non-cable transmitted data allows for analyzing the influence of a wired connection on the beam characteristic of the radiation emitted by the DUT.

According to a second aspect of the invention, a method for measuring beam characteristics of electro-magnetic radiation emitted by a device under test (DUT) is provided. The method comprises the steps of setting an operating mode of a first antenna to a communication mode with the aid of a switch. With the communication mode set, the steps of establishing a first test communication link to a device under test with the aid of the first antenna, transmitting test communication data including beam steering control data through the first antenna to the device under test (DUT) and, controlling a beam steering of the device under test with the aid of a control/analyzing unit, are performed. Furthermore, locking a beam of the device under test at a particular direction with the aid of a test interface is performed. The method further comprises the step of setting the operation mode of the first antenna to a measuring mode with the aid of the switch and to perform the steps of receiving electro-magnetic radiation emitted by the DUT, for example, with the aid of the first antenna and analyzing the electro-magnetic radiation received by the first antenna with the aid of the control/analyzing unit. The measuring mode further includes the step of unlocking the beam with the aid of the test interface. Advantageously test communication data comprising beam steering control data in order to control the beam steering of the DUT is transmitted to the device under test, for example, through the first antenna. Furthermore, the locking means and the switch allow to perform a measurement in the measurement mode of a locked beam emitted by the DUT with the same first antenna, that is used to send test communication data the device under test in the communication mode.

According to a first implementation form of the second aspect, the method further comprises the step of moving the first antenna to a desired measuring position with the aid of the control and analyzing unit.

According to a further implementation form of the second aspect, the method further comprises the step of configuring a second antenna, the link antenna, to establish a second test communication link to the device under test and additionally or alternatively, configuring the control and analyzing unit to control a beam steering of the device under test via the second test communication link.

According to a further implementation form of the second aspect, the method further comprises the step of transmitting test communication data through the link antenna and additionally or alternatively, establishing the second test communication link when the operating mode of the first antenna is the measuring mode. However, the first communication link and the second communication link may also be established at the same time, when the operation mode of the first antenna is the communication mode. Advantageously, the second test communication link and the transmission of test communication data through the link antenna over that second test communication link in the measuring mode allows communication with the DUT even when the first antenna is in measuring mode and is only capable of receiving measuring data from the DUT.

According to a further implementation form of the second aspect, the method further comprises the step of shielding the radiation generated by the link antenna. Advantageously, no radiation generated by the link antenna is received by the measurement antenna. Thus, a distortion of the measuring signal due to the communication signal is prevented.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawings and description are to be regarded as illustrative in nature, and not as restrictive.

BRIEF DESCRIPTION OF THE DRAWINGS

Embodiments of the present invention are illustrated by way of example, and not by way of limitation, in the figures of the accompanying drawings, in which like reference numerals refer to similar elements, and in which.

DETAILED DESCRIPTION

A test system and a method for measuring beam characteristics a device under test (DUT), providing an improved communication link for transmitting beam steering control data in order to control the beam steering of the DUT, are described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

Figure 1:
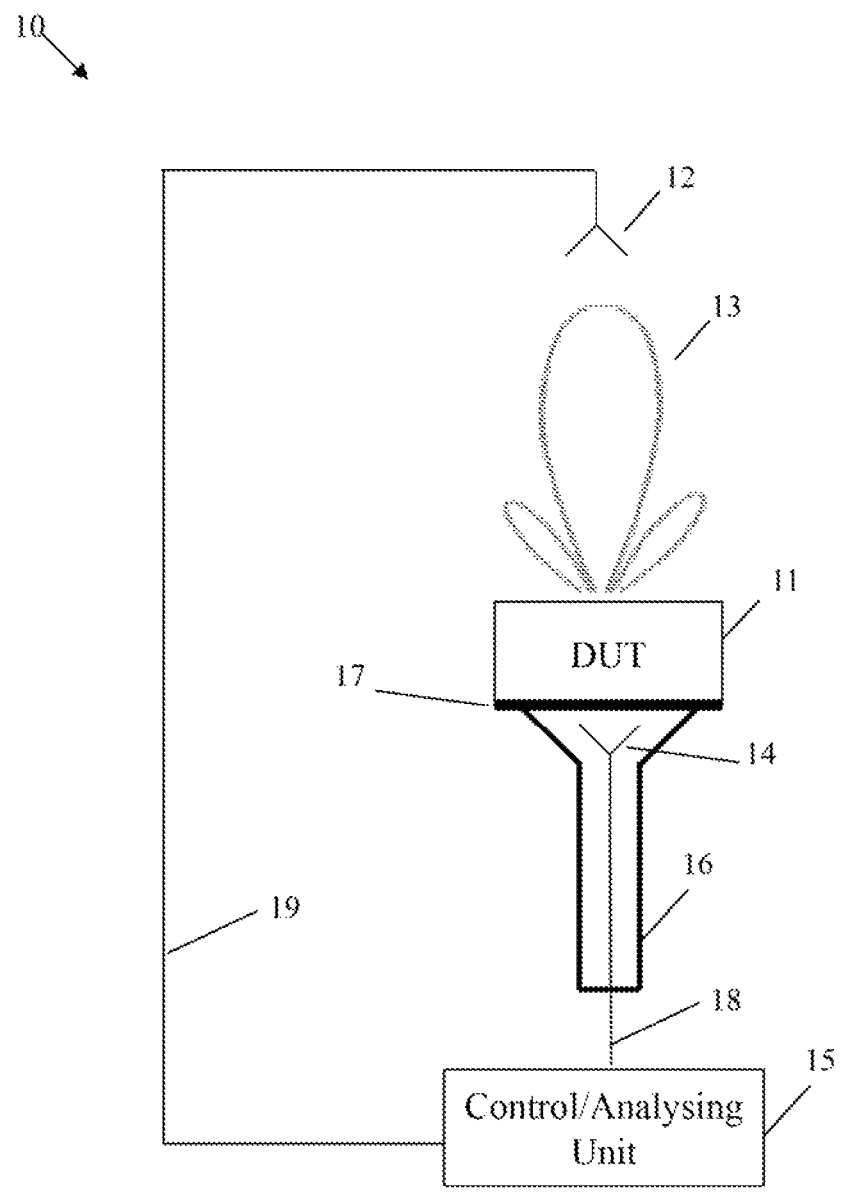
FIG. 1 shows a diagram of test system for measuring beam characteristics of electro-magnetic radiation emitted by a device under test, in accordance with example embodiments of the present invention.

FIG. 1 shows a diagram of test system 10 for measuring beam characteristics of electro-magnetic radiation emitted by a device under test (DUT), in accordance with example embodiments of the present invention. The invention is not limited to this embodiment and all features below are explained for the purpose of example only.

According to example embodiments, the test system 10 comprises the DUT 11, a measurement antenna 12, a link antenna 14 and a control/analyzing unit 15 connected to the link antenna 14 via a cable connection 18 and connected to the measurement antenna 12 via a cable connection 19. Further, a shielding 16, 17 of the link antenna 14 is depicted in FIG. 1.

By way of example, the DUT 11 may include a test interface to input beam steering data and/or communication data to the DUT. Advantageously, such test interface prevents the need to use the antenna of the DUT for wireless communication, which would result in a distortion of the beam characteristic measurement of the DUT.

By way of further example, the measurement antenna 12 may be a single horn-antenna that is movable in all directions around the DUT. Arm positioners or robotic arms to provide this functionality are well known to the person skilled in the art and are therefore not described within this document.

By way of further example, several antenna elements may be provided to form a phased array antenna, which allows the measurement of the electro-magnetic radiation 13 emitted by the DUT 11, without moving the measurement antenna 12.

By way of further example, the link antenna 14 may be a patch antenna or a horn antenna that is located in the near field of the electro-magnetic radiation 13 emitted by the DUT 11. Since non-radiative near-field behaviors of electromagnetic fields dominate close to the antenna of the DUT, the radiation transmitted by the link antenna is not influenced by the radiation emitted by the DUT 11, which requires reduced transmission power of the link antenna 14.

Advantageously, a reduced transmission power of the link antenna 14 prevents that the link antenna radiation is received by the measurement antenna 12 and negatively impacts the measurement of the beam characteristics.

According to further example embodiments, the control/analyzing unit 15 is configured to control a beam steering of the DUT 11 and to analyze signals 13 from the DUT 11 received by the measurement antenna 12. The communication data 13 generated by the control/analyzing unit 15 and transmitted to the DUT 11 through the link antenna 14 comprises beam steering control data in order to control the beam steering of the DUT.

Figure 2:
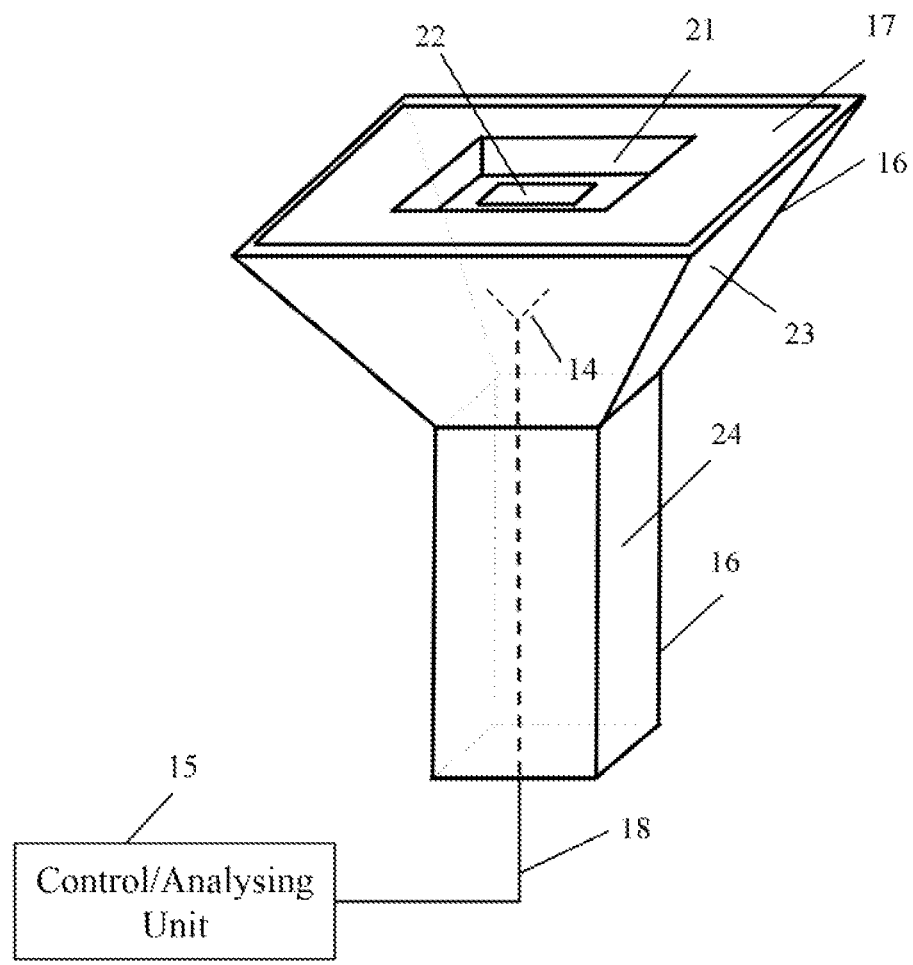
FIG. 2 shows a diagram of the shielding of FIG. 1, including a frame to mount the device under test as part of the shielding, in accordance with example embodiments of the present invention.

Further, FIG. 1 shows a shielding 16, 17 of the link antenna 14, that is shown in more detail in FIG. 2. A purpose of the shielding is to prevent that radiation generated by the link antenna 14 is received by the measurement antenna 12 and falsifies the measurement result of the beam characteristics measurement.

Advantageously, the test system 10 according to the present invention does not require a wired connection between the DUT 11 and the control/analyzing unit 15. Since a wired connection to the DUT 11 modifies the radiation characteristics of the DUT 11, thus another beam characteristic than defined by the control/analyzing unit 15 would be emitted by the DUT.

FIG. 2 shows a diagram of the shielding 16, 17 of FIG. 1, including a frame 17 to mount the DUT 11 as part of the shielding, in accordance with example embodiments of the present invention.

According to example embodiments, the shielding 16 has the form of a truncated pyramid 23, wherein at the opposite side of the pyramid base a cuboid 24 extends. Other forms of shielding geometries are conceivable. The frame 17 for mounting the DUT 11 that is part of the shielding provides a recess 21 to receive and then include the DUT 11. The recess 21 has an opening 22 on the bottom side to provide a passage for the electro-magnetic radiation generated by the link antenna to the test interface provided to input beam steering data and/or communication data to the DUT.

According to further example embodiments, instead of an opening 22 in the recess 21 a material that is permeable for radio frequency radiation (RF) can be provided.

According to further example embodiments, the frame 17 for mounting the DUT 11 can be replaceable by frames with different recesses, openings or even no recess or no opening to be able to use several measurement adapters that allow for testing different DUTs with different geometry, with a limited effort to change the test setup. Advantageously, testing identical devices with a test adapter maintains the same measurement conditions for each measurement and increases reproducibility.

Figure 3:
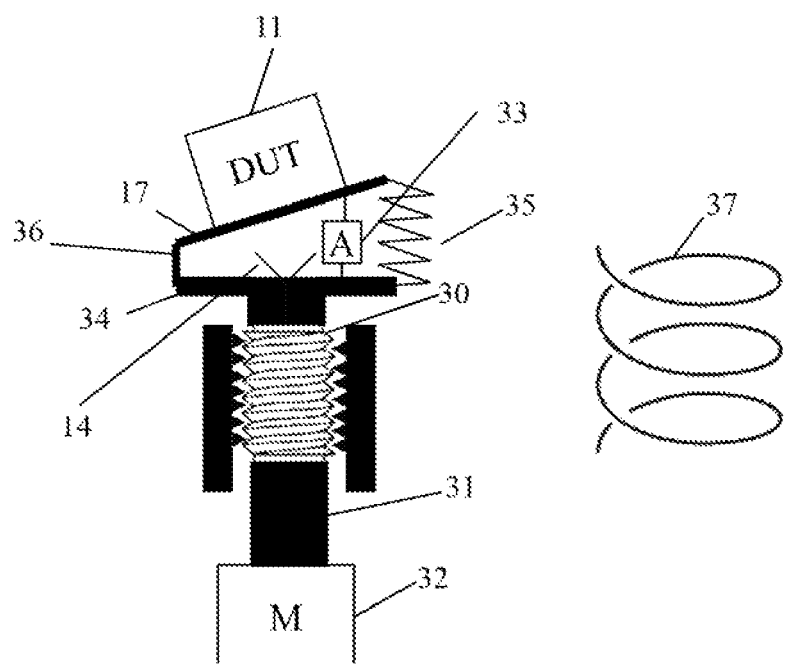
FIG. 3 shows an example holder that may be used to hold and adjust the position of the device under test, in accordance with example embodiments of the present invention.

FIG. 3 shows an example holder or positioner that may be used to hold and adjust the position of the DUT, in accordance with example embodiments of the present invention According to example embodiments, the frame 17 is configured to incorporate the DUT 11 is connected to a hinge 36 that is connected to a first planar surface 34 attached to a first end of an axis 31, wherein the axis 31 comprises a thread 30 for moving the first planar surface 34 up and down with the aid of a motor 32 attached to a second end of the axis 31. Accordingly, rotating the axis 31 with the aid of the motor 32 serves the height adjustment of the first planar surface 34, and thus also of the DUT 11.

Further, the DUT 11 is attached to a second planar surface, which is the frame 17, configured to incorporate the DUT 11 which is attached to the first planar surface 34 in a manner whereby the DUT may be tilted for example with the hinge 36 mentioned before. For the purpose of tilting the DUT 11, and thus for tilting the frame 17 configured to incorporate the DUT 11 with respect to the first planar surface 34, the positioner comprises an actuator 33 which tilts the second planar surface 17 with respect to the first planar surface 34.

According to example embodiments, the shielding for the embodiment according to FIG. 3 is realized by the first planar surface 34, the hinge 36 or similar element to allow for tilting the second planar surface 17 with respect to the first planar surface 34, the second planar surface which is the frame configured to mount the DUT, which is described in detail in FIG. 2. Further, a flexible shielding material 35 is provided, that is connected to one end of the first planar surface 34 and to one end of the second planar surface 17.

In addition to this, FIG. 3 illustrates an example trace 37 of movement of the DUT 11 in the case that the DUT 11 is moved down in a tilted condition, which leads to the helical trace 37.

Figure 4:
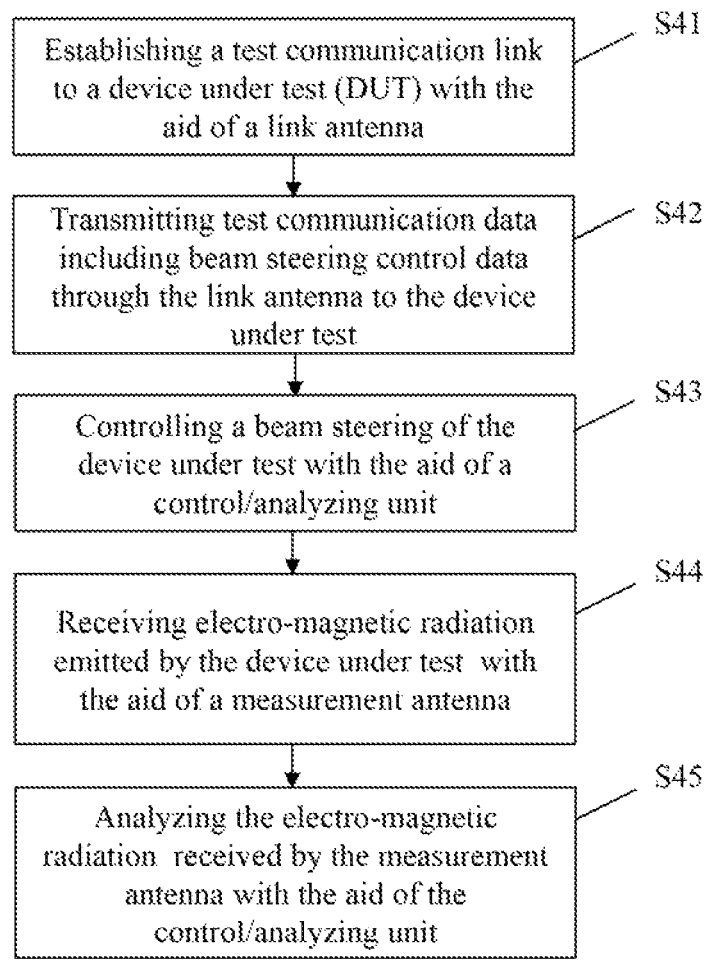
FIG. 4 shows a flow chart of a method for measuring beam characteristics of electro-magnetic radiation emitted by a device under test, in accordance with example embodiments of the present invention.

FIG. 4 shows a flow chart of a method for measuring beam characteristics of electro-magnetic radiation emitted by a DUT (DUT), in accordance with example embodiments of the present invention. In a first step S41, a test communication link to a DUT (DUT) 11 is established with the aid of a link antenna 14. In a second step S42, test communication data including beam steering control data is transmitted through the link antenna 14 to the DUT 11. In a further step S43, beam steering of the DUT 11 is controlled with the aid of a control/analyzing unit 15. In a further step S44, electro-magnetic radiation 13 emitted by the DUT 11 is received with the aid of a measurement antenna 12. In step S45, the electro-magnetic radiation received by the measurement antenna 12 is analyzed with the aid of the control/analyzing unit 15.

Figure 5:
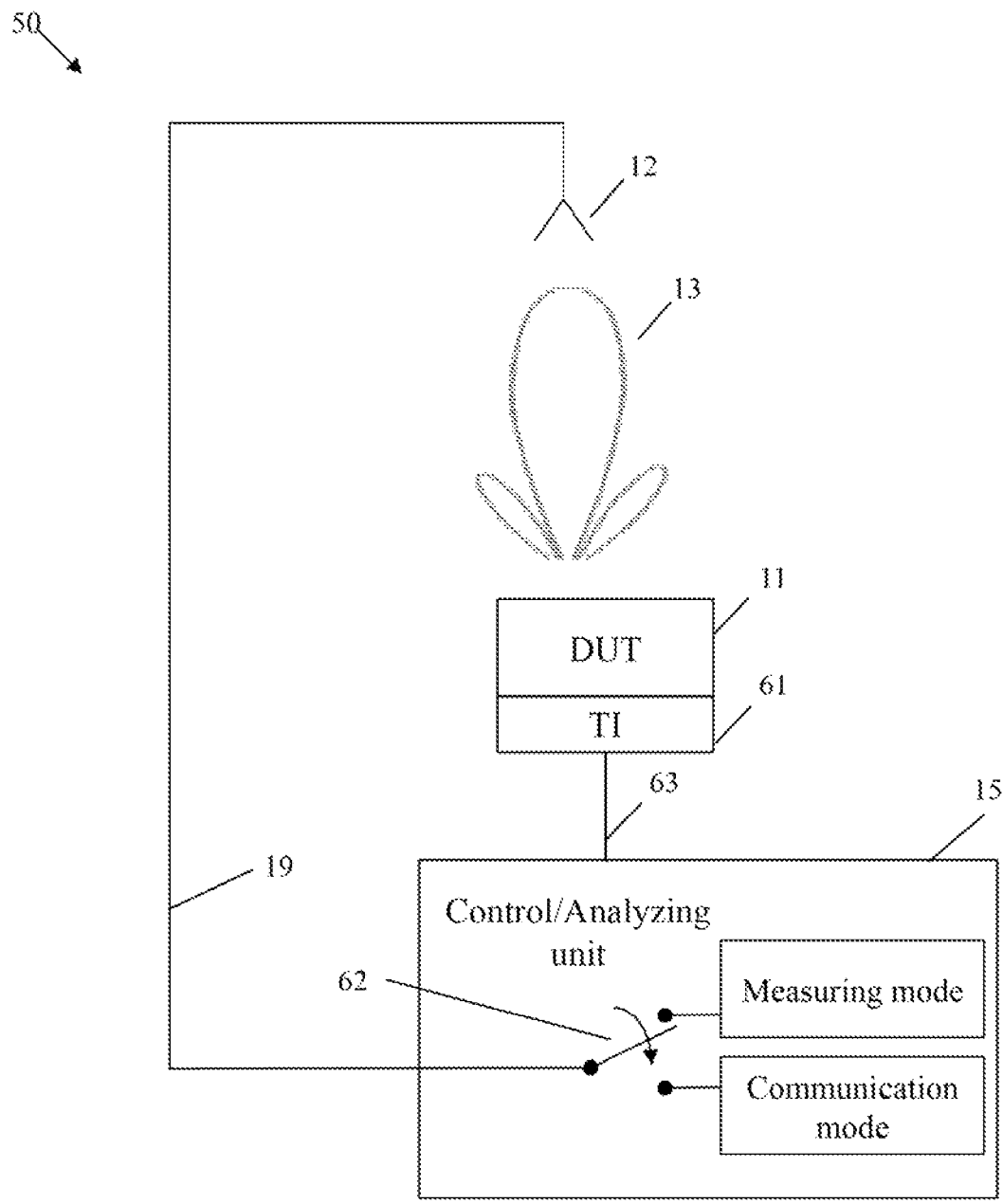
FIG. 5 shows a block diagram of an example test setup for a test system for measuring beam characteristics of electromagnetic radiation emitted by a device under test, including a test interface with beam locking means and a switch to set an operating mode, in accordance with example embodiments of the present invention.

FIG. 5 shows a block diagram of an example test setup for a test system 50 for measuring beam characteristics of electro-magnetic radiation emitted by a device under test, including a test interface with beam locking means and a switch to set an operating mode, in accordance with example embodiments of the present invention. The invention is not limited to this embodiment and all features below are explained for the purpose of example only.

The test system 50 comprises a device under test (DUT) 11, a first antenna 12, a switch 62, a test interface 61 and a control/analyzing unit 15.

With reference to FIG. 5, the switch 62 is located inside the control/analyzing unit 15 and sets the operating mode of the first antenna 12 to a measuring mode or to a communication mode. Thus, the switch 62 controls the control/analyzing unit 15 to determine if the first antenna 12 is operated as a measuring antenna or as a communication antenna. The first antenna 12 is connected to the control/analyzing unit 15, respectively to the switch 62 via cable connection 19. The antenna in communication mode can be called an acting link antenna to point out, that during the communication mode a first test communication link is established and test communication data is exchanged with the DUT.

By way of example, exchange of test communication data takes place on an upper physical layer, such as layer 2 and/or layer 3.

By way of further example, when the communication mode is set by the switch 62, the first antenna 12 is configured to establish a first test communication link and test communication data is transmitted through the first antenna to the DUT 11. The test communication data includes beam steering control data in order to control beam steering of the DUT 11. The test communication data may be sent to the DUT 11 via the test interface 61, however, the test communication data may alternatively be sent directly to the transmission antenna of the DUT. The control/analyzing unit 15 is configured to receive test communication data from the first antenna 12 and further to transmit test communication data to the DUT through the first antenna 12.

By way of further example, when the measuring mode is set by the switch 62, the first antenna 12 is configured to receive electro-magnetic radiation 13 emitted by the device under test 11 and the control/analyzing unit 15 is configured to receive the signals to be analyzed from the DUT 11 through the first antenna 12.

With reference to FIG. 5, the test interface 61 is connected to the control/analyzing unit 15 in a wireless manner and/or via a cable connection 63, and is configured to input beam steering data and/or communication data to the DUT 11. In addition, the test interface 61 provides beam locking means of a beam generated by the DUT 11 to lock or unlock the beam based on an input signal. The test interface 61 is further connected wireless or via cable to the DUT 11, or may be incorporated into the DUT 11. Further, the beam locking means is configured to control beam steering such to lock the beam in a particular direction and to unlock the beam direction. Locking the beam is triggered by the test interface 61 based on an input signal and/or command, wherein such a command can be a "Beam Lock" command. By way of example, unlocking the beam may be triggered by the test interface 61 based on an input signal and/or command, wherein such a command can be a "Beam Unlock" command. Thus, for measuring a beam in a specific direction in the 3-dimensional space, the beam can easily be locked in a particular direction with the aid of the beam locking means. By way of further example, the beam locking may be performed after the first antenna and/or the beam have reached a desired position and/or when the beam and the antenna have a defined position to each other. By way of further example, the beam generated by the DUT may follow the first antenna movement, while the first antenna is switched to the communication mode. When the "Beam Lock" command or any other appropriate input signal controls the test interface to lock the beam, the beam following the antenna movement is locked at the phase center of the first antenna and the operating mode is switched to the measuring mode.

Advantageously, a moving beam can easily be locked in a desired direction in 3-dimensional space depending on the position of an antenna and/or on a desired beam position. Thus, in a very efficient manner, the spatial position between the antenna and the beam can be easily set.

By way of further example, the beam unlocking may be performed after a defined period and/or when analyzing of the signals from the device under test is completed, in other words, when the beam measurement is completed and/or when the first antenna has reached a defined position.

By way of further example, the first antenna 12 may be a single horn-antenna that is movable in all directions around the device under test. Arm positioners or robotic arms to provide this functionality are well known to the person skilled in the art and are therefore not described within this document.

By way of further example, several antenna elements may be provided to form an array antenna, which allows the measurement of the electro-magnetic radiation 13 emitted by the device under test 11, without moving the first antenna 12.

Figure 6:
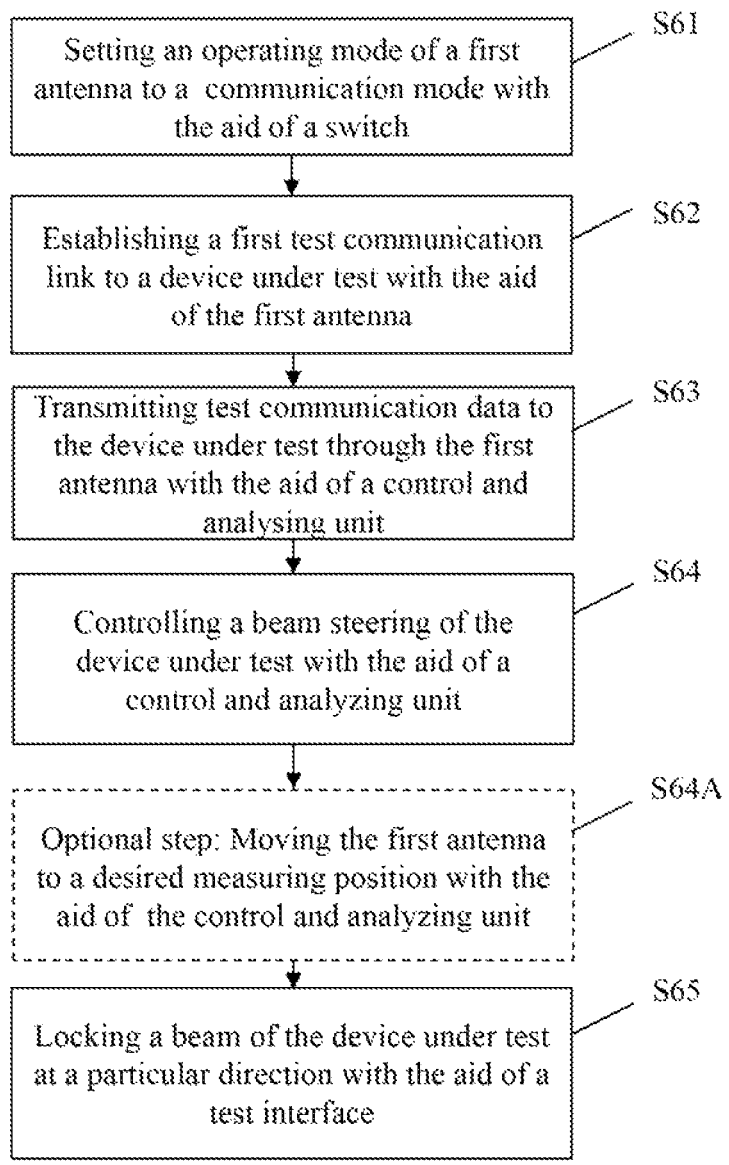
FIG. 6 shows a flow chart of an example test method for measuring beam characteristics of electro-magnetic radiation emitted by a device under test, with the steps performed in communication mode, in accordance with example embodiments of the present invention.

FIG. 6 shows a flow chart of an example test method for measuring beam characteristics of electro-magnetic radiation emitted by a device under test, with the steps performed in communication mode, in accordance with example embodiments of the present invention. The flow chart of FIG. 6 depicts one of two operating modes, the communication mode of a first antenna 12 of the test method for measuring beam characteristics, as described in FIG. 5. In Step S61, the operating mode of the first antenna is set to a communication mode with the aid of a switch 62. In Step S62, a first test communication link to a device under test (DUT) 11 is established with the aid of the first antenna 12. In Step S63, test communication data including beam steering control data is transmitted through the first antenna 12 to the DUT 11.

By way of example, the test communication data may be transmitted to the DUT 11 via the test interface 61, however, the test communication data may alternatively be transmitted to the transmission antenna of the DUT. The transmission of test communication data through the first antenna 12 is performed with the aid of a control/analyzing unit 15, configured to control a beam steering of the device under test 11 by generating test communication data comprising beam steering control data. By way of further example, in an optional Step S64A, the first antenna is moved to a desired position in the 3-dimensional space defined by a spherical or Cartesian coordinate-system or any other suitable coordinate-system with the aid of a robotic arm or any suitable positioning system.

In Step S65, a beam 13 emitted by the device under test 11 is locked at a particular direction with the aid of a test interface receiving an input signal. The input signal may be a specific command to lock the beam, a "Beam Lock" command. By way of further example, the "Beam Lock" command may configure the test interface 61 to repetitively send the beam steering control data representing the beam at the time when the "Beam Lock" command was sent to the device under test 11 to maintain the beam as long as the beam is locked. By way of example, before locking the beam, during the transmission of test communication data from the first antenna (the acting link antenna), the beam generated by the DUT follows the movement of the measurement antenna. When the input signal to lock the beam generated by the DUT 11 is received by the test interface, the beam is locked at the phase center of the acting link antenna. Thus, the first antenna, which is the acting link antenna, is already in the optimal position to measure the locked beam.

Figure 7:
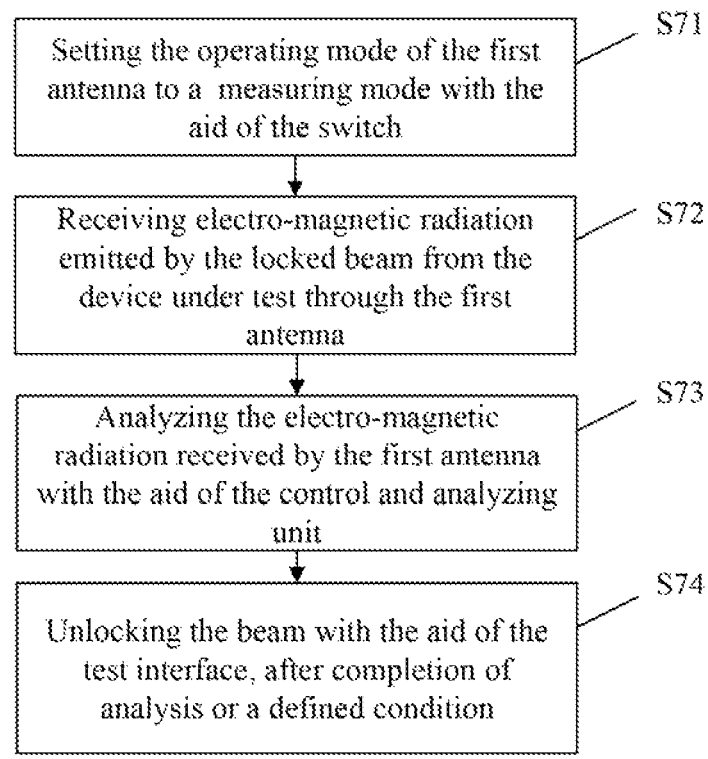
FIG. 7 shows a flow chart of an example test method for measuring beam characteristics of electro-magnetic radiation emitted by a device under test, with the steps performed in measuring mode, in accordance with example embodiments of the present invention.

FIG. 7 shows a flow chart of an example test method for measuring beam characteristics of electro-magnetic radiation emitted by a device under test, with the steps performed in measuring mode, in accordance with example embodiments of the present invention. The flow chart of FIG. 7 shows the second of the two operating modes, the measuring mode of a first antenna 12 of the test method for measuring beam characteristics, as described in FIG. 5. In Step S71, the operating mode of a first antenna is set to a measuring mode with the aid of a switch 62. Since the first antenna is switched to a measuring mode and is receiving electro-magnetic radiation, the first test communication link is de-activated.

By way of example, when switching in the measuring mode, a second test communication link may be established to the device under test with the aid of a second antenna. In Step S72, the first antenna is configured to receive electro-magnetic radiation emitted by a locked beam from the device under test 11. In Step S73, the electro-magnetic radiation, received by the first antenna is analyzed with the aid of a control/analyzing unit.

In Step S74, the locked beam is unlocked due to an input signal received by the test interface 61 and/or after the completion of analyzing the electro-magnetic radiation received by the locked beam and/or after a defined condition, for example, after a defined locking period or triggered by a user. By way of further example, the input signal to unlock the locked beam may be a specific command to unlock the beam, a "Beam Unlock" command, sent to the test interface 61. By way of further example, the "Beam Unlock" command may be sent to the test interface by the second antenna (the link antenna) which establishes a second test communication link with the DUT 11, when the first antenna 12 is switched from the communication mode into the measuring mode with the aid of the switch 62.

Advantageously, the test system 50 according to the present invention allows to easily measure a beam 13 generated by the DUT 11 by simply sending an input signal, for example, a "Beam Lock" command to the test interface 61. Since the locked beam has a defined position related to the first antenna and since the locked beam is not changing, an accurate measurement of the beam characteristics can be performed without limited measurement time. After the measurement is completed the beam can be easily unlocked and a next measurement can be prepared. Further, the measurement task can be performed with one antenna only, since the first antenna 12 can be operated as a measuring antenna and as a communication antenna.

While various embodiments of the present invention have been described above, it should be understood that they have been presented by way of example only, and not for limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A test system for measuring beam characteristics, comprising:
    a device under test;
    a first antenna;
    a switch;
    a test interface configured to input test communication data to the device under test; and
    a control and analyzing processor configured to control a beam steering of the device under test and to analyze signals from the device under test; and
    wherein the test communication data transmitted to the device under test comprises beam steering control data in order to control the beam steering of the device under test,
    wherein the test interface is configured to lock a beam generated by the device under test, and
    wherein the test system is configured to move the device under test in a helical trace.

2. The test system according to claim 1, wherein the test interface is configured to one or more of control beam steering to lock the beam in a particular direction and to unlock the beam direction, and to lock or unlock the beam in response to an input signal received by the test interface.

3. The test system according to claim 1, wherein the switch is configured to set an operating mode of the first antenna, and wherein the operating mode is a measuring mode or a communication mode.

4. The test system according to claim 3, wherein the measuring mode configures the first antenna to receive electro-magnetic radiation emitted by the device under test, and wherein the communication mode configures the first antenna to establish a first test communication link to the device under test.

5. The test system according to claim 4, wherein, in the measuring mode, the control and analyzing processor is configured to receive the signals to be analyzed from the device under test through the first antenna, and wherein, in the communication mode, the control and analyzing processor is configured to one or more of receive test communication data from the device under test through the first antenna and transmit test communication data to the device under test through the first antenna.

6. The test system according to claim 1, wherein the first antenna is one or more of movable around the device under test and an array antenna configured to receive the electro-magnetic radiation emitted by the device under test and to transmit test communication data to the device under test without moving the first antenna.

7. The test system according to claim 1, wherein the system further comprises:
a second antenna configured to provide a second test communication link to the device under test.

8. The test system according to claim 7, wherein the second test communication link is established when the first antenna is set to the measuring mode.

9. The test system according to claim 7, wherein the second antenna is positioned in a near field of the radiation emitted by the device under test.

10. The test system according to claim 7, wherein the second antenna is located inside a radiation shielding area.

11. The test system according to claim 7, wherein the second antenna is one or more of configured for test communication data to be transmitted through it and, movable relative to the device under test.

12. The test system according to claim 1, wherein the device under test is mounted on a mount configured to adjust the position of the device under test.

13. The test system according to claim 1, wherein the test interface is configured to receive one or more of beam steering data and communication data in one or more of a wireless manner and via a cable connection.

14. A method for measuring beam characteristics, the method comprising:
setting an operating mode of a first antenna to a communication mode via a switch;
establishing a first test communication link to a device under test via a first antenna;
transmitting test communication data, including beam steering control data, to the device under test;
controlling a beam steering of the device under test via a control/analyzing processor;
locking a beam of the device under test at a particular direction via a test interface;
setting the operating mode of the first antenna to a measuring mode via the switch;
receiving electro-magnetic radiation emitted by the device under test via the first antenna;
analyzing the electro-magnetic radiation received by the first antenna via the control/analyzing processor;
unlocking the beam via the test interface; and
moving the device under test in a helical trace.

15. The method according to claim 14, further comprising:
moving the first antenna to a desired measuring position via the control/analyzing processor.

16. The method according to claim 14, further comprising one or more of:
configuring a second antenna to establish a second test communication link to the device under test; and
configuring the control/analyzing processor to control a beam steering of the device under test via the second test communication link.

17. The method according to claim 16, further comprising one or more of:
transmitting test communication data through the second antenna; and
establishing the second test communication link when the operating mode of the first antenna is in the measuring mode.

18. The method according to claim 16, wherein the method further comprises the step of shielding the radiation generated by the link antenna.

* * * * *